United States Patent
Badstübner et al.

(10) Patent No.: US 8,481,864 B2
(45) Date of Patent: Jul. 9, 2013

(54) METHOD FOR THE PRODUCTION OF A FUNCTIONAL CONSTRUCTIONAL UNIT, AND FUNCTIONAL CONSTRUCTIONAL UNIT

(75) Inventors: Kathrin Badstübner, Hersching (DE); Frank Ansorge, München (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 1185 days.

(21) Appl. No.: 11/916,923

(22) PCT Filed: Jun. 30, 2006

(86) PCT No.: PCT/EP2006/006612
§ 371 (c)(1),
(2), (4) Date: Mar. 14, 2008

(87) PCT Pub. No.: WO2007/006483
PCT Pub. Date: Jan. 18, 2007

(65) Prior Publication Data
US 2008/0196928 A1 Aug. 21, 2008

(30) Foreign Application Priority Data
Jul. 11, 2005 (DE) .......................... 10 2005 032 270
Feb. 20, 2006 (DE) .......................... 10 2006 008 332

(51) Int. Cl.
*H05K 1/11* (2006.01)
(52) U.S. Cl.
USPC ............ 174/261; 174/520; 174/260; 361/761

(58) Field of Classification Search
USPC ................... 361/761–764, 792–795; 174/520, 174/260–261
See application file for complete search history.

(56) References Cited

U.S. PATENT DOCUMENTS

| | | | | |
|---|---|---|---|---|
| 5,397,857 A | * | 3/1995 | Farquhar et al. | 174/520 |
| 6,160,714 A | | 12/2000 | Green et al. | |
| 6,465,742 B1 | * | 10/2002 | Hiraoka et al. | 174/255 |
| 7,180,749 B2 | * | 2/2007 | Tsukahara et al. | 361/761 |
| 2005/0087851 A1 | | 4/2005 | Fuergut et al. | |
| 2005/0168960 A1 | * | 8/2005 | Asahi et al. | 361/761 |

FOREIGN PATENT DOCUMENTS

| | | |
|---|---|---|
| DE | 19854036 A1 | 5/2000 |
| EP | 1357597 A | 10/2003 |

OTHER PUBLICATIONS

German International Search Report for International Application PCT/EP2006/006612.

(Continued)

*Primary Examiner* — Jeremy Norris
(74) *Attorney, Agent, or Firm* — Timothy X. Gibson, Esq.; Gibson & Dernier LLP

(57) ABSTRACT

The invention relates to a method for producing a functional assembly as well as a functional assembly. According to the inventive method, at least one first material and a second material which are provided with different properties are applied layer by layer, partially in some parts, so as to create an encapsulation from the first material and a strip conductor structure from the second material, one or several functional units being embedded in the layer structure and being contacted with the strip conductor structure when the materials are applied. The disclosed method makes it possible to carefully structure a unit while offering a great degree of creative freedom.

17 Claims, 1 Drawing Sheet

Schnitt A-A

OTHER PUBLICATIONS

German International Written Opinion for International Application PCT/EP2006/006612.

International Preliminary Report on Patentability and Written Opinion for International Application PCT/EP2006/006612.

* cited by examiner

Schnitt A-A

METHOD FOR THE PRODUCTION OF A FUNCTIONAL CONSTRUCTIONAL UNIT, AND FUNCTIONAL CONSTRUCTIONAL UNIT

FIELD OF THE INVENTION

The invention relates to a method for production of a functional constructional unit and also to a functional constructional unit.

BACKGROUND

Functional constructional units, which have an encapsulation, a strip conductor structure and a functional unit which is embedded in the encapsulation and is contacted with the strip conductor structure, are known. Such a functional constructional unit would typically be an electronic component, for example a chip, which is encapsulated with a casting material and one or more conductors which contact the chip electronically. Constructional units of this type are also termed "packages".

Known methods for production of functional constructional units of this type provide firstly that the functional unit is provided with a strip conductor structure, for the purpose of which for example the functional unit and the strip conductor structure are disposed together on a solid substrate. In a further step, a casting material is poured around this component, as a result of which the functional unit and strip conductor structure are encapsulated.

It is a disadvantage of the casting method that the component to be embedded is stressed greatly thermally and mechanically because of the injection pressure and the temperature of the casting material. Furthermore, the arrangement of the functional unit and the arrangement of the strip conductor structure within the encapsulation is limited in that the latter must be established before the embedding or must be introduced subsequently after the embedding.

SUMMARY OF THE INVENTION

It is hence the object of the present invention to produce a method for production of a functional constructional unit in the case of which the functional units contained in the functional constructional unit are only slightly stressed mechanically and thermally, and virtually any arrangement of functional units and strip conductor structure within the encapsulation is possible. Furthermore, it is an object of the invention to produce a functional constructional unit having the mentioned properties.

The invention achieves this object by a method for production of a functional constructional unit and by a functional constructional unit according to the independent claims.

As a result of the fact that, by means of partly partial application, in layers, of at least one first material and one second material, first material and second material having different properties, there are produced an encapsulation from the first material and a strip conductor structure from the second material, one or more functional units being embedded in the layer structure during application of the materials and being contacted with the strip conductor structure, on the one hand the functional unit or the functional units, during construction of the functional constructional unit, are only slightly stressed thermally and mechanically, if at all, so that even sensitive functional units can be a component of a functional constructional unit. On the other hand, because of the construction of the encapsulation and strip conductor structure in layers, virtually any construction of the strip conductor structure and also any arrangement of the functional unit or functional units is possible. The method according to the invention consequently allows great freedom in the configuration of the functional constructional units.

The functional units can be of an electronic nature, for example chips, in particular non-housed chips, of a mechanical nature, for example switches or lead frames, of an optical nature, for example lens systems, optical strain gauges, in particular fibre Bragg gratings or also combinations. Fundamentally, the functional unit can involve any type of use.

The strip conductor structure can be designed correspondingly for conducting current, heat or light. Also combinations of different conductor types are possible.

Preferably, the materials for production of the layer structure are applied in such a manner that respectively one layer is completely sealed before the next layer is applied. In particular, each layer is applied in such a manner that the surface of the (entire) layer is even.

Fundamentally, it is also possible to construct firstly a plurality of layers of the one material in a locally delimited manner and subsequently to complete the resulting recesses only thereafter by applying the other materials. Furthermore, it is basically also possible to apply layers with different layer thicknesses.

This type of application is however relatively complex and demands complex devices, as a result of which constant layer thicknesses and completion of the respective layer is preferred according to the invention.

The mentioned alternatives could however be justified for example on the basis of the properties of the materials to be applied, the arrangement of the functional units and also the strip conductor structure, and also the spatial forming of the functional constructional unit.

Encapsulation and strip conductor structure are components of the layer structure. Furthermore, further materials also can be applied in layers and hence can be likewise a component of the layer structure. In particular, further strip conductor structures or further encapsulations can be constructed from materials with different properties.

The invention relates to methods for generative construction of three-dimensional structures having at least one embedded component and at least two different materials which have different properties.

The objects which are produced in this manner can contain functional components (e.g.: electronic components, optical components, substrate materials, metal layers) which are integrated in the course of the construction process. In this way, functional prototypes can be produced or rapid manufacturing of products can be operated. The invention jointly includes new packaging concepts by means of this method idea with respect to electronic packaging (encapsulation of sensitive electronic elements) of non-housed chips.

Current generative manufacturing methods from the field of rapid prototyping technologies enable production of samples, prototypes and workpieces—according to the STL data produced previously in a CAD program—from formless material without the use of special tools.

High quality models for e.g. original forms which are faithful in detail can thus be provided in a cost effective manner and within the shortest time for subsequent processes, such as e.g. vacuum casting.

Generative manufacturing methods have been used to date in order to produce non-functional components which are then used merely as display samples or original models for continuing rapid prototyping processes, such as e.g. the vacuum casting process.

Previously, during the construction process, neither was the process for embedding any components interrupted nor were cavities provided for inserting these. The plants of generative manufacturing processes are designed for constructional tasks in which there is no necessity to interrupt the printing process in order to make it possible to add a component described above in more detail.

In addition, previously the process took place merely with a very limited material palette of constructional material so that for example it is impossible to lead the contacts outwards in the manner described in more detail subsequently.

In addition, different materials cannot be processed in parallel within one x-y plane but at most in layers one above the other. However for the intended course of the method, this would be a requirement. The two method steps, embedding of functional components and simultaneous application of materials having different properties, have not yet been put into practice either alone or in combination.

Since the properties of the components manufactured from the materials used in the generative manufacturing process make it possible merely to use the latter in a very narrow field of use (sample, display model, housing, . . . ), the inventive idea comprises application of materials which extend the narrow field of use since materials are used which provide functions, such as conduction of the electrical current or dissipation of heat, for example electrically conductive and heat-conductive materials.

With the inventive idea, it is possible to produce functional prototypes which contain functional embedded components and at least two in particular printable materials with different properties being able to be processed within one x-y plane. By applying different materials in one horizontal plane of a three-dimensional model in combination with functional embedded components, a completely new generation of prototypes can be constructed.

In order that the for example electrical signals of embedded electronic components or the resulting heat loss from embedded power semiconductors can be conducted to the exterior, either expedient inserted parts must be used or functional layers produced. These layers assume specific tasks. Electrically conductive and heat-conductive materials which are processed generatively would be used at this point. The production of functional, three-dimensional layers or strip conductor structures can then be effected at the same time as the construction of the entire object. For example the printing of a housing, including the electronic contents, the contacts and terminals, can thus be effected. The construction of a described functional prototype may then be achieved relatively simply manually by means of doctor blade technology and adapted templates.

Hence it is possible to manufacture fairly complex objects, for example in a printing process, which include functional components or which enable the object to perform functions.

It is consequently possible to manufacture products which can be used beyond the stage of a display sample also as functional objects and which can be applied directly. Rapid manufacturing by means of the new method idea is possible.

The method could be used in the field of electronic packaging for a new encapsulation technology which combines the advantages of conventional encapsulation technologies. Conventional encapsulation methods, such as transfer moulding, liquid encapsulation, hot melt, vacuum casting or injection moulding, operate either at high injection pressures and high temperatures which can damage sensitive electronic components or the form of the subsequent package must be provided by means of individually constructed tools.

A generative construction of encapsulation material confers the huge advantage, on the one hand, that fine electronic structures are subjected to minimal mechanical and thermal stresses. On the other hand, any packaging forms can be provided without a tool, which offers huge cost advantages and savings in time.

Relative to the already mentioned packaging of electronic non-housed chips, the use of electrically conductive and heat-conductive, generatively processable materials are included in the inventive idea. In this way, for example three-dimensional structures in layers (e.g. strip conductor structures) can be produced during construction of the object which then conduct the electrical signals or the heat outwards from the interior of the package. The process steps which are required for construction of the prototype thereby take place preferably within one horizontal layer.

Furthermore, it is conceivable to apply a plurality of materials with different mechanical properties in particular at the same time in order to produce for example fairly flexible encapsulations, for example around a sensitive electronic component, and to protect for example the inner encapsulation simultaneously from environmental influences (moisture, temperature, EMV screening) with a harder outer encapsulation.

Conceivable application examples would be:
packaging of non-housed chips
embedding of printed circuit boards and metal layers
via-less printed circuit boards with internal wiring
housing and circuit carriers without assembly steps.

Advantageous developments of the invention are described in the dependent claims.

An advantageous development of the invention provides that first and second material are applied in liquid state and cured after application, first and second material being curable.

Liquid application allows formation of layers. Furthermore, because of liquid application of the layers, the connection to the respective lower layer can also be produced so that a strong bond is produced. Adhesives and frictional attachment means omitted, such as clamps, can in this way be for fixing the layer structure.

By means of curing, the materials are solidified so that the next layer can be applied. According to the choice of curable material, the curing can be effected for example by electromagnetic radiation, such as UV light, or heat.

As materials for application, in particular as first and second material for encapsulation and strip conductor structure, materials with a component of a curable polymer are preferably used A further advantageous development of the invention provides that the curing is effected in layers, preferably respectively after one application of an individual material.

Application of a plurality of layers without curing could have the result that the contours of the applied layers become indistinct. By means of curing in layers, preferably respectively after one application of an individual material, the contour is maintained.

A further advantageous development of the invention provides that a functional unit is embedded by the layer structure in a form fit.

As a result, the mechanical stability of the functional unit is produced without further means. Preferably, the functional unit is embedded in the layer structure on all sides so that protection of the functional unit takes place on all sides.

A further advantageous development of the invention provides that the strip conductor structure is guided towards the outer surface of the constructional unit.

As a result of the fact that the strip conductor structure is guided towards the outer surface of the constructional unit, the functional unit can be contacted from outside.

A further advantageous development of the invention provides that the layers are constructed in such a manner that the functional constructional unit has a cuboid form.

A cuboid form of the constructional unit is advantageous if the constructional unit is intended to be used as a component of a more complex system, for example as a module of a modular system. As a result of a cuboid form, stacking or combining a plurality of constructional units adjacently is possible in an advantageous manner since, on the one hand, a space-saving arrangement is possible and, on the other hand, the flat surfaces of the constructional units can be used as support surfaces for other constructional units.

Furthermore, the invention produces a functional constructional unit having an encapsulation, a strip conductor structure and one or more functional units which are embedded in the encapsulation and are contacted with the strip conductor structure, the encapsulation and the strip conductor structure being constructed as a component of a layer structure in a large number of layers situated one above the other.

A functional constructional unit of this type can be produced in particular with the method according to the invention. Correspondingly, the functional constructional unit according to the invention can also have the embodiments and advantageous developments described within the scope of the method.

BRIEF DESCRIPTION OF THE DRAWINGS

The invention is explained in more detail now with reference to an embodiment which is represented by two Figures. There are thereby shown FIG. 1 an embodiment of a functional constructional unit according to the invention in a diagonal view, FIG. 2 a cross-sectional view of the functional constructional unit shown in FIG. 1.

DETAILED DESCRIPTION OF THE INVENTION

Figure 1:
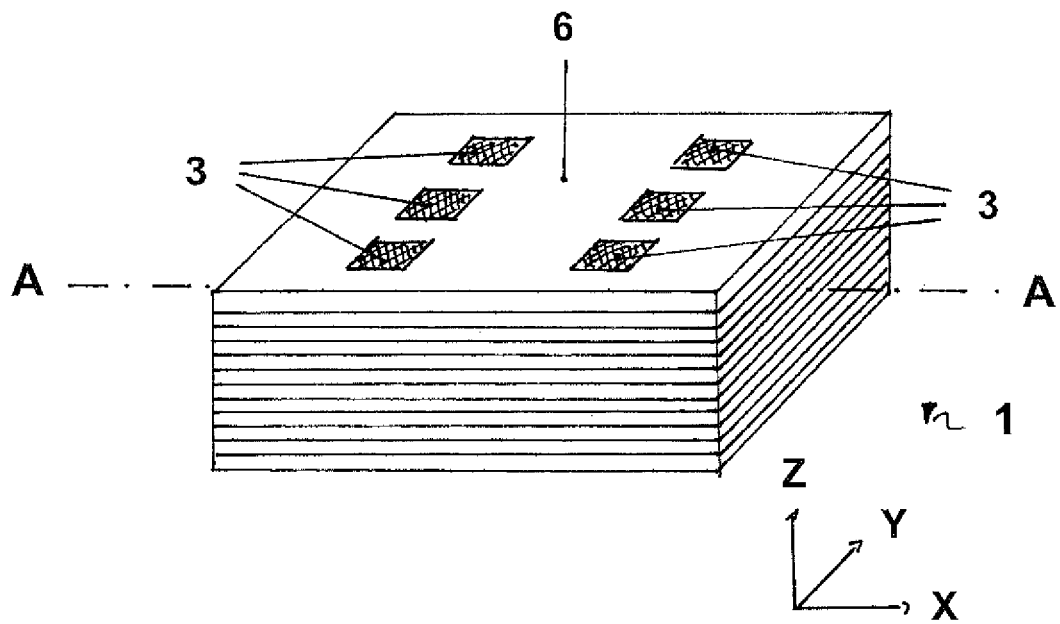
Figure 2:
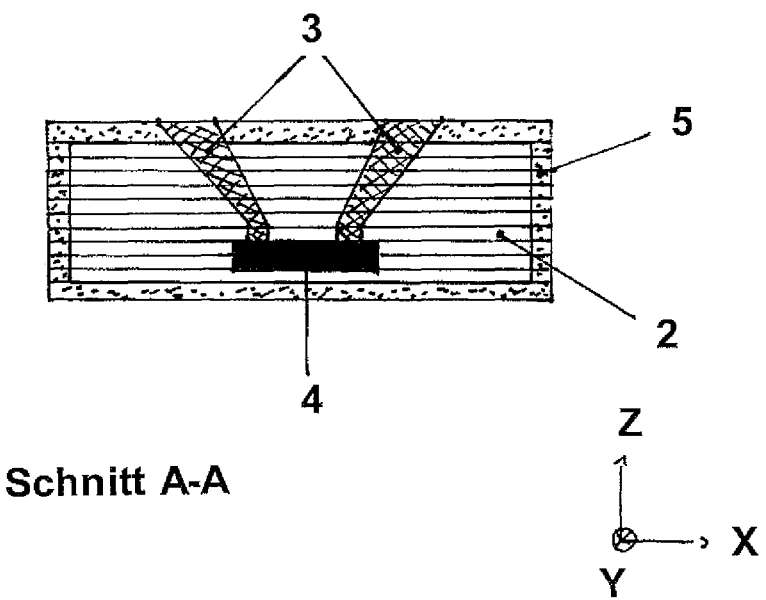

FIG. 1 shows an embodiment of a functional constructional unit 1 according to the invention. FIG. 2 shows a section of the constructional unit shown is FIG. 1.

The constructional unit 1 has an encapsulation 2, a strip conductor structure 3 and a functional unit 4 which is embedded in the encapsulation 2 and is contacted with the strip conductor structure 3.

Furthermore, the constructional unit 1 has an outer shell 5 which completely surrounds the encapsulation 2.

The functional unit 4 is surrounded in a form fit and completely by the strip conductor structure 3 and the encapsulation 2. The strip conductor structure 3 is guided towards the outer surface 6 of the constructional unit, as a result of which contacting of the functional unit 4 is possible.

The constructional unit 1 has the form of a cuboid.

The encapsulation 2, the strip conductor structure 3 and the outer shell 5 are constructed as a layer structure comprising a large number of layers situated one above the other. In this embodiment, the layers have a form which is plane-parallel in the XY plane with a uniform layer thickness. The layers are situated one above the other in the Z axis. They are connected to each other securely, in this case as a result of surfaces of adjacent layers which are melted together at least in regions.

According to the position, an individual layer is subdivided into a plurality of regions, these regions being assigned to the outer shell 5, the encapsulation 2 or the strip conductor structure 3.

In this embodiment, the functional unit 4 is a chip. The strip conductor structure 3 comprises a polymer with an electrically conductive supplement, as a result of which the electrical contact to the functional constructional unit 4 is produced, on the one hand, and as a result of which heat can be dissipated. Encapsulation 2 and outer shell 5 likewise comprise polymers. All the polymers used are curable polymers.

The constructional unit 1 according to the invention can be produced with the method according to the invention.

By means of partly partial application, in layers, of a first material, a second material and a third material, the materials having different properties, there are produced from the first material an encapsulation 2, from the second material a strip conductor structure 3 and from the third material an outer shell 5.

During application of the materials, the functional unit 4 is embedded in the layer structure and contacted with the strip conductor structure 3.

First, second and third material are applied in liquid state and cured after application.

The curing is effected in layers, respectively after one application of an individual material.

In this embodiment, materials which are curable by UV light were used as materials for application. Correspondingly, the materials were cured with UV light after each application.

The partial application in layers of the individual materials can be achieved for example by means of doctor blade technology and adapted templates. The functional units or also further inserted parts thereby can be placed manually or also with the aid of correspondingly precise positioning devices (e.g. Fineplacer by Finetec).

The invention claimed is:

1. A method for production of a functional constructional unit, wherein, by means of partly partial application, in layers, of at least one first material and one second material a layer structure of a plurality of layers is produced, the first material and second material having different properties, and an encapsulation being produced from the first material and a strip conductor structure being produced from the second material, one or more functional units being embedded in the layer structure during application of the materials and being contacted with the strip conductor structure, wherein a surface of each layer is substantially even and each layer is of substantially constant thickness, wherein the first and the second material are applied in liquid state and cured after application, the first and second material being curable and wherein the curing is effected in layers.

2. A method according to claim 1, wherein the curing is effected in layers, respectively after one application of an individual material.

3. A method according to claim 1, wherein a functional unit is embedded by the layer structure in a form fit.

4. A method according to claim 1 wherein the strip conductor structure is guided towards an outer surface of the constructional unit.

5. A method according to claim 1 wherein the layers are constructed in such a manner that the functional constructional unit has a cuboid form.

6. A constructional unit according to claim 1, wherein the layers are produced by a printing process.

7. A functional constructional unit having an encapsulation made from a first material, a strip conductor structure made from a second material having properties different from the first material and one or more functional units which are embedded in the encapsulation and are contacted with the strip conductor structure, wherein the encapsulation and the strip conductor structure are constructed as a component of a layer structure in a large number of layers situated one above the other, wherein the layers are substantially even and of substantially constant thickness, wherein the first and the second material are applicable in liquid state and curable after application, and wherein the curing is effected in layers.

8. The constructional unit according to claim 7, wherein a functional unit is embedded in the layer structure in a form fit.

9. The constructional unit according to claim 7, wherein the strip conductor structure is guided towards an outer surface of the constructional unit.

10. The constructional unit according to claim 7, wherein the encapsulation and strip conductor structure comprise materials with a component of a curable polymer.

11. The constructional unit according to claim 7, wherein the constructional unit has an outer shell which surrounds the encapsulation.

12. The constructional unit according to claim 11, wherein the outer shell is constructed in layers corresponding to the encapsulation and the strip conductor structure.

13. The constructional unit according to claim 7, wherein the constructional unit has a cuboid form.

14. A functional constructional unit having an encapsulation made from a first material, a strip conductor structure made from a second material having properties different from the first material and one or more functional units which are embedded in the encapsulation and are contacted with the strip conductor structure, wherein the encapsulation and the strip conductor structure are constructed as a component of a layer structure in a large number of layers situated one above the other, wherein the layers are substantially even and of substantially constant thickness and wherein at least one of the one or more functional components has a thickness larger than the thickness of each layer.

15. A constructional unit according to claim 14, wherein at least one of the one or more functional components is an electronic component.

16. A constructional unit according to claim 14, wherein at least one of the one or more functional components is an optical component.

17. A constructional unit according to claim 14, wherein the layers are produced by a printing process.

* * * * *